(12) United States Patent
Bean et al.

(10) Patent No.: US 6,404,164 B1
(45) Date of Patent: Jun. 11, 2002

(54) METHOD OF BATTERY CHEMISTRY IDENTIFICATION THROUGH ANALYSIS OF VOLTAGE BEHAVIOR

(75) Inventors: Heather N Bean, Fort Collins; Scott A Woods, Bellvue; Christopher A. Whitman, Fort Collins, all of CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/859,015

(22) Filed: May 14, 2001

(51) Int. Cl.$^7$ ................ H02J 7/16; H02J 7/00
(52) U.S. Cl. ................ 320/106; 320/157
(58) Field of Search ................ 320/106, 162, 320/157

(56) References Cited

U.S. PATENT DOCUMENTS

| | | | |
|---|---|---|---|
| 5,352,968 A | 10/1994 | Reni et al. | 320/35 |
| 5,455,499 A | 10/1995 | Uskali et al. | 320/43 |
| 5,656,917 A | 8/1997 | Theobald | 320/22 |
| 5,656,920 A | 8/1997 | Cherng et al. | 320/31 |
| 5,739,596 A | 4/1998 | Takizawa et al. | 307/66 |
| 5,818,197 A | 10/1998 | Miller et al. | 320/107 |
| 5,844,884 A | 12/1998 | Szlenski | 370/149 |
| 5,883,497 A | 3/1999 | Turnbull | 320/132 |
| 5,889,385 A | 3/1999 | Podrazhansky et al. | 320/130 |
| 5,965,998 A | 10/1999 | Whiting et al. | 320/165 |
| 5,998,972 A | 12/1999 | Gong | 320/134 |

FOREIGN PATENT DOCUMENTS

| | | | | |
|---|---|---|---|---|
| JP | 04132979 A | * | 5/1992 | G01R/31/36 |
| JP | 06249931 A | * | 9/1994 | G01R/31/36 |
| JP | 07241039 A | * | 9/1995 | H02J/07/00 |
| JP | 10189060 A | * | 7/1998 | H01M/10/48 |
| JP | 2000261975 A | * | 9/2000 | H02J/07/00 |

* cited by examiner

Primary Examiner—Gregory Toatley

(57) ABSTRACT

A method of identifying battery chemistry of a battery in an electronic device monitors voltage behavior of the battery in response to a stimulus. The method can be performed in the electronic device while the device is in normal operation without affecting battery life or the user's enjoyment. Further, the method can be performed many times within the device also without compromising battery life or user enjoyment. A system implements the method in the electronic device. The present invention provides for more accurate battery fuel gauging, such that a battery's end of life is more readily determinable, and allows for various battery chemistries to be drained to their optimal cutoff voltage, and allows for the safe in-device charging of rechargeable batteries that are the same size and shape as non-rechargeable batteries.

20 Claims, 7 Drawing Sheets

METHOD OF BATTERY CHEMISTRY IDENTIFICATION THROUGH ANALYSIS OF VOLTAGE BEHAVIOR

TECHNICAL FIELD

This invention relates to battery technology. In particular, the invention relates to identifying battery type from voltage behavior in an electronic device.

BACKGROUND OF THE INVENTION

Electronic devices capable of deriving operating power from one or more batteries are popular, widely available and in widespread use. Many of these electronic devices would be much less successful and even lose much of their market viability without the availability of reliable battery power. In particular, portable electronic devices generally depend on batteries as a primary power source. For example, popular portable electronic devices such as notebook and laptop computers, hand-held computers and personal digital assistants (PDAs), digital cameras, and cellular telephones would be of little or no use without battery power.

Electronic devices that employ batteries can use batteries as either a primary power source or as a secondary power source. In some cases the electronic device is powered entirely by a DC power supply based on a battery. In other cases, the battery powered electronic device can be operated either using battery power or using an external DC or AC power source. Generally, an AC adapter that converts the AC into DC provides the external DC power source for those electronic devices that use external DC power. The external AC/DC power source is also commonly used for recharging batteries in portable electronic devices that utilize in-situ rechargeable battery cells.

In simple terms, a battery is a device that converts chemical energy into electricity. A variety of battery types that have application to powering electronic devices are commercially available. Batteries can be divided into two broad classes depending on whether the battery is rechargeable or non-rechargeable. The distinction between rechargeable and non-rechargeable batteries is often important since attempting to recharge non-rechargeable batteries can lead to venting or leaking of electrochemical materials, and in extreme cases can result in dangerous explosions.

Directly related to whether or not a battery is rechargeable is the particular battery chemistry that is employed. The 'chemistry' of the battery refers to the specific combination of electrolytes and electrode materials used in the battery to create the chemical reaction that produces electrical power. Several battery chemistries, some of which produce rechargeable batteries and some of which produce non-rechargeable batteries, are in use and commonly available.

A common battery chemistry used for electronic devices is the well-known alkaline battery. The standard alkaline battery employs an alkaline gel, usually potassium hydroxide, as an electrolyte. The positive electrode is normally made of magnesium dioxide and the negative electrode is typically made of zinc. Other battery chemistries commonly used to power electronic devices include but are not limited to high-drain alkaline, high-energy lithium, nickel-metal hydride (NiMH) and nickel-cadmium (NiCd). Of these, normally only batteries having NiMH or NiCd chemistries are rechargeable while the others are generally not rechargeable. Batteries of different chemistries generally have different electrical properties such as open-circuit voltage, charge capacity, and peak current capacity. These electrical properties are a direct result of the characteristics of the chemical reactions taking place within the batteries. The unique characteristics of a chemical reaction such as rate, reaction path, and reactants involved are sometimes referred to collectively as the reaction's 'kinetics'.

Consumer batteries are most often classified based on the physical size and shape of the battery and only secondarily on chemistry and rechargeability. The physical size and shape of a battery is sometimes referred to as the 'form-factor' of the battery. Many battery chemistries are available in more than one form-factor. More to the point, some of the popular form-factors are available in more than one battery chemistry. Thus, even though different chemistries have different kinetics and rechargeability characteristics, the form-factor of the battery may not reflect any difference between them at all.

Electronic devices are available that utilize batteries having a wide variety of different form-factors. Both standard form-factors and custom form-factors are in common use. Available standard form-factors include but are not limited to AA, AAA, C and D cells. Many of the commercially available consumer battery chemistries can be found in more than one of the standard form-factors. Custom battery form-factors include customized single cells as well as specialized battery packs that contain more than one cell. A battery or battery pack having a customized form-factor is sometimes referred to as an 'application-specific' battery. Specialized application-specific battery packs and custom form-factors are most typically associated with battery chemistries that are rechargeable, though non-rechargeable battery types are available in some non-standard form-factors as well.

Most portable electronic devices monitor the battery during use and typically provide a charge level indicator or so-called 'fuel gauge' associated with battery life. The fuel gauge is intended to keep the user of the device apprised of the power remaining in the battery and, by extension, the probable remaining operating time of the electronic device. In addition, the fuel gauge is used by the device to determine a cut-off point in the battery discharge profile beyond which the device will cease to operate.

Fuel gauges on portable electronic devices generally attempt to 'predict' the power remaining based on measurements, usually voltage measurements, performed on the battery. Unfortunately, the accuracy of these measurements can and usually does depend on battery chemistry. For example, a voltage based fuel gauge calibrated for alkaline batteries will most likely not be accurate for NiMH batteries of the same form factor. Most portable electronic devices that can accept AA size batteries can utilize a variety of battery chemistries that are available in the AA form-factor. Unfortunately, as discussed hereinabove, the different battery chemistries do not behave the same way kinetically during discharge, especially in the presence of a short duration moderately high load. Thus, it is very difficult for conventional fuel gauging techniques to be accurate in high drain devices which can accept multiple battery chemistries and have no way of distinguishing one battery chemistry from another.

Most battery powered electronic products currently on the market use one of two methodologies in conjunction with monitoring batteries and providing fuel gauging. A first methodology known as current or power monitoring, determines the energy capacity remaining in a battery by monitoring the power or current passing into and out of the battery. This methodology requires knowledge of the approximate amount of energy that can be drained from the battery before it is discharged. As such, the use of power/ current monitoring is generally restricted to electronic devices that utilize a battery where characteristics such as the battery chemistry and size are known a priori such as an application-specific battery pack. An application-specific battery pack is generally manufactured and distributed under the control of the electronic device manufacturer. Therefore, the manufacturer can impose limits on the battery pack specifications and thus effectively have a great deal of control over the accuracy of the battery monitoring and fuel gauging using the power/current monitoring methodology. Essentially, the fuel gauge can be calibrated accordingly based on the a priori knowledge of the application-specific battery pack performance characteristics.

Because a priori knowledge of battery characteristics is not possible in devices that accept multiple battery brands or chemistries, the power/current monitoring methodology generally is not used for fuel gauging in these devices. It is usually impossible to know with sufficient accuracy how much energy to expect from such a wide variety of battery types and/or from different manufactures of a given battery type. Therefore, for electronic devices that accept multiple battery types, especially multiple battery chemistries, an approach other than power/current monitoring is desirable.

A second methodology, most applicable to devices that utilize standard form-factor batteries such as AA cells, involves monitoring a change in voltage over a change in time (dv/dt) of the battery voltage during discharge. The change in voltage with respect to time is referred to as the voltage slope of the battery. If the voltage slope characteristics are known for a given battery type, a reasonable prediction can generally be made regarding power remaining based on a measured voltage at various points during the discharge cycle of the battery. Therefore, a periodic measurement of the battery voltage can be used to monitor the battery and provide a fuel gauge for the electronic device.

Unfortunately, the slope of the battery voltage during discharge is highly dependent on battery chemistry as well as peak and average discharge rates. Thus, conventional fuel gauges based on voltage monitoring are typically calibrated for the battery chemistry (e.g. alkaline) most commonly used in conjunction with the electronic device. The calibration of a fuel gauge for a particular battery chemistry yields good fuel gauge accuracy when using batteries of the calibrated chemistry. Conversely, the fuel gauge can report wholly erroneous results when a battery chemistry other than the one the gauge was calibrated for is used. For example, alkaline batteries have a fairly predictable sloping discharge profile and thus the methodology based on voltage monitoring works well with the alkaline battery chemistry. However, most non-alkaline batteries have a much flatter voltage discharge profile than alkaline batteries, making it difficult to detect any significant change in voltage until the battery is almost completely discharged. In other words, the scale used for voltage monitoring of alkaline batteries generally cannot be used as the scale for non-alkaline batteries without a significant reduction in fuel gauge accuracy.

Consider for example, a fuel gauge in an electronic device that has been calibrated for alkaline batteries using voltage monitoring. If lithium-iron disulfide batteries are used in the device instead of alkaline batteries, the fuel gauge that was calibrated for alkaline batteries will read the lithium-iron disulfide batteries as having 100% charge until the lithium-iron disulfide batteries are approximately 90% discharged. As another example, consider a device that uses voltage monitoring and that has been calibrated for NiMH batteries. If alkaline batteries are used instead of the NiMH batteries, the fuel gauge will report the alkaline batteries as being fully charged until they are approximately 80% discharged. Therefore, slope monitoring can be very inaccurate for chemistries other than the chemistry for which the device is calibrated.

Alkaline batteries are by far the most common battery type used in portable electronic products. As a result, most portable electronic products that employ the voltage monitoring fuel gauge methodology have fuel gauges that are calibrated for alkaline batteries. With the proliferation of alternative battery chemistries, such as lithium-iron disulfide and nickel metal hydride cells, and their relative availability to consumers, fuel gauges calibrated to alkaline batteries alone are becoming less accurate for many consumers. Consumers (electronic device users) are generally unaware of the very different voltage discharge behaviors among the various battery chemistries and often become frustrated with portable electronic devices when the battery gauge appears to be inaccurate. The end result of fuel gauge inaccuracy is that battery life is often sacrificed in favor of consistent device operation.

Thus, it would be advantageous to provide battery powered electronic devices with the ability to automatically identify the battery chemistry being used in the device. Such a device could adjust its fuel gauging system accordingly to provide more accurate information on battery life to the consumer or user. In addition, such a device could detect whether the battery is rechargeable or not and either enable or disable in-device charging. The device could also adjust the cutoff point used by the device for a particular chemistry to enable a given battery to be drained to an optimal discharge voltage level.

SUMMARY OF THE INVENTION

The present invention is a method and system of identifying battery chemistry of batteries in an electronic device by monitoring voltage behavior of the batteries in response to a stimulus. Advantageously, this method and system can perform the identification in the electronic device while the device is in normal operation without affecting the life of the battery or interfering with the user's enjoyment of the electronic device. Moreover, the method and system of identifying battery chemistry of the present invention can be performed many times during the operation of the electronic device without compromising battery life or user enjoyment.

The method and system of the present invention provide for more accurate battery fuel gauging than conventional methods. The increased fuel gauge accuracy afforded by the battery chemistry identification method and system facilitates more effective use of the fuel gauge, including making a battery's end-of-life more readily determinable and allowing for various battery chemistries to be drained to their optimal cutoff voltage. The method of the present invention is implemented in the electronic device by the system that monitors the voltage of a battery during normal use or operation of the electronic device.

In one aspect of the invention, a method of identifying battery chemistry of a battery in an electronic device by monitoring battery voltage recovery after removal of a known moderately high drain load is provided. The method comprises the steps of applying a moderately high load to a battery for a load period of time followed removing the load. Just as the load is removed, the voltage of the battery is monitored at time intervals that are shorter than the load period for a recovery time period. The battery chemistry of the battery is determined from voltage recovery with respect to time data obtained during the step of monitoring.

In another aspect of the invention, a method of identifying battery chemistry of a battery in an electronic device by monitoring voltage decline immediately after an application of a moderately high (or greater) load is provided. The method comprises the step of applying a moderately high load to a battery during a load period. Just as the load is applied, the voltage of the battery is monitored for a decline period at time intervals of less than the decline period. The battery chemistry of the battery is determined from voltage decline with respect to time data obtained during the step of monitoring.

In still another aspect of the invention, a method of identifying a battery chemistry of a battery in an electronic device is provided that monitors voltage decline immediately after an application of a moderately high (or greater) load, and then monitors voltage recovery after the load is removed. The method comprises the step of applying a moderately high load to a battery for a load period of time. Just as the load is applied, the voltage of the battery is monitored for a decline period at first time intervals that are less than the decline period. The method further comprises the step of measuring a first slope of the voltage during the load period from voltage decline data obtained in the step of monitoring. The method still further comprises the steps of removing the load and monitoring the voltage of the battery just after the load is removed for a recovery period at second time intervals that are less than the recovery period. A second slope of the voltage during the recovery period is measured from voltage recovery data obtained in the step of monitoring after the load is removed. The battery chemistry of the battery is determined from the measured first slope and the measured second slope data obtained in the steps of measuring.

In each of the methods, the battery chemistry determination is made by comparing the monitored or measured data to a set of predetermined reference values or ranges representing the responses of various battery chemistries to similar load conditions. The measured data in each method represent different electrical quantities related to aspects of the particular battery chemistry kinetics being measured. The step of determining comprises identifying a set of predetermined values that most closely match the measured data. The chemistry associated with the set of values that were identified is then chosen as the best guess for the battery chemistry. Any one of the above methods can be used independently.

In yet still another aspect of the present invention, a system that implements the method of the present invention in an electronic device is provided. The system eliminates the need to make compromises in designing a one-size-fits-all battery system for electronic devices. Further, the system automates the method of battery type identification in the electronic device during normal operation without the need for an artificial load that reduces the battery lifetime. The system comprises a monitoring subsystem to monitor or collect voltage data of an installed battery for a short period of time in response to a stimulus (load) and a calculation subsystem to calculate the slope of the battery voltage with respect to time and to make a best guess identification of the battery chemistry.

The method and system of the present invention allows for fuel gauging in the electronic device to be much more accurate than when the battery chemistry is not known a priori or the device is not calibrated for the particular chemistry. Importantly, the system can distinguish rechargeable battery chemistries from non-rechargeable battery chemistries. Further, the present invention allows for various chemistries to be drained to their optimal cutoff point or voltage, thereby ensuring a battery life intrinsic to the battery chemistry.

BRIEF DESCRIPTION OF THE DRAWINGS

The various features and advantages of the present invention may be more readily understood with reference to the following detailed description taken in conjunction with the accompanying drawings, where like reference numerals designate like structural elements, and in which.

MODES FOR CARRYING OUT THE INVENTION

Figure 1:
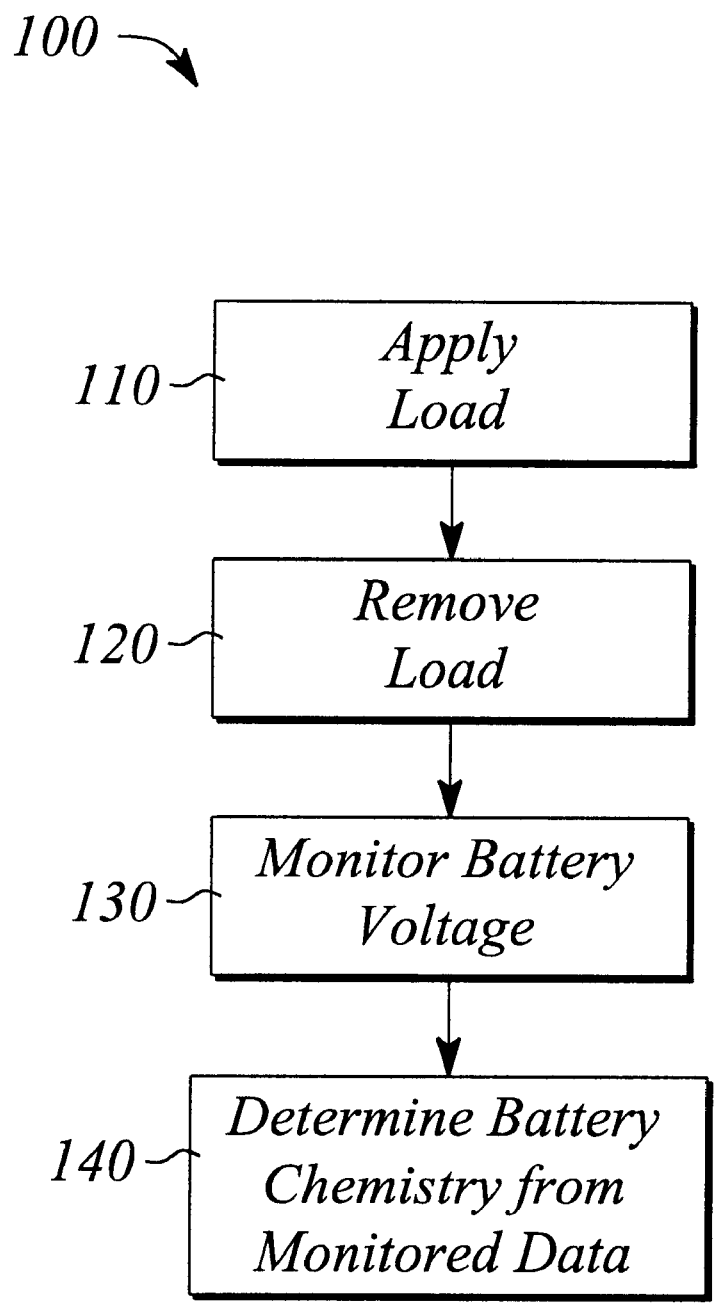
FIG. 1 illustrates a flow chart of one embodiment of a method of the present invention.

The present invention is a method and system that implements the method for identifying battery chemistry of batteries installed in an electronic device, especially a portable electronic device. The method and system identify battery chemistry by monitoring voltage behavior of the batteries in response to a stimulus associated with normal operation of the device. Advantageously, the method and system can perform the identification on an installed battery and can perform the identification while the device is in normal operation. Moreover, the identification can be performed without affecting the life of the battery, without interfering with the normal operation of the device, and without affecting the enjoyment of the device by the user. Furthermore, the method and system can perform the identification many times in the device, also without compromising battery life and without interfering with device operation or user enjoyment. The method and system of the present invention provide for more accurate battery fuel gauging, facilitate a more readily determinable end of life prediction for a battery, and allow for various battery chemistries to be drained to their optimal cutoff voltage.

For the purposes of the invention, the stimulus is a moderately high load that occurs during normal device operation. Preferably, the moderately high load has a known, repeatable characteristic effect on the battery. Still further, the load can be variable or fixed, as long as it is repeatable. The load can be applied to the battery for any length of time (i.e., the load period can be of short duration or long duration) in accordance with the invention. It has been determined that various battery chemistries behave differently in response to a moderately high load. The most pronounced differences occur immediately after applying or removing the load. The period of time immediately after the application or removal of a load is known as a transient load period. Thus, advantageously and unexpectedly, the battery chemistry can be identified or determined with relative accuracy using data collected regarding the battery response to the load during the transient load period.

Since there are many different electronic devices to which the invention is applicable, the 'moderately high load', the load period and the transient load period may be different for each different electronic device. For example, a short duration moderately high load during normal operation in a laptop computer is a read or write operation to a removable disk; in a digital camera is a recharge of a strobe or flash bulb capacitor or the use of a motor that operates a zoom lens; in a PDA is turning on a backlight for a liquid crystal display; and in a portable CD player is the use of a motor to 'spin up' the CD. An example of a long duration moderately high load in each of the above devices is the normal operating load of the electronic device. In this case a transient load period occurs when the device is switched 'ON' or 'OFF' or when the device is switched to/from a 'stand-by' mode.

In general, the long duration moderately high load is defined as a normal average operating load as opposed to a low or quiescent load, such as is experienced when the device is in 'stand-by' or is 'OFF'. In this case, the moderately high load is at least approximately 150% of the low load, for example. A short duration moderately high load is defined as a load that is at least approximately 150% of the average load on the battery during device operation, for example. The transient load period is generally less than or equal to 0.1% of the normal operational period of the device. Typically, the transient load period is approximately 0.2 to 3 seconds and, when using AA cells, the moderately high load is in the range of 0.5 to 2.0 Watts per cell. Since these characteristics are basically electronic device dependent, they are not intended to limit the scope of the invention. Modification of the load and/or the transient load period and the load period will still provide for identification in accordance with the invention with possible varying degrees of accuracy.

In one aspect of the invention, a method 100 of identifying battery chemistry of a battery in an electronic device comprises monitoring battery voltage recovery after the application of a moderately high load to the battery. FIG. 1 illustrates a flow chart of the method 100 of the present invention. The method 100 of identifying battery chemistry comprises the step of applying 110 a moderately high load to a battery for a load period of time.

The method 100 further comprises the step of removing 120 the load, and just as the load is removed 120, the step of monitoring 130 a voltage of the battery. The step of monitoring 130 comprises monitoring the battery voltage at time intervals during a recovery time period following the load period and collecting measured data for the monitored 130 battery voltage. The recovery time period is less than or equal to the transient load period, which is less than or equal to the load period. The time intervals are shorter than the recovery period. Typically, the recovery period in the step of monitoring 130 is about 1 or more seconds. The time intervals at which the battery voltage is monitored 130 typically are each less than or equal to 20% of the recovery period. Preferably, each time interval is approximately 0.1 seconds.

The method 100 further comprises the step of determining 140 the battery chemistry of the battery from the measured voltage recovery data obtained during the step of monitoring 130. Preferably, the determination 140 of the battery chemistry is made by generating a voltage recovery slope value from the measured battery voltage data collected during the step of monitoring 130. The recovery slope is then compared to a set of reference recovery slope values. More preferably, the determination 140 is made by comparing the recovery slope in conjunction with a measured final recovered voltage to a set of reference recovery slope and final recovered voltage values. The measured final recovered voltage is the highest voltage measured during the recovery period. A best guess of the battery chemistry is then made based on the comparison.

In a preferred embodiment, the set of reference recovery slope values and final recovered voltage values are stored in the form of a look-up table. each entry in the table being a slope value associated with a different battery chemistry. Preferably, the reference slope and final recovered voltage values for a set of battery chemistries are predetermined and applicable to the load conditions of the step of applying 110. For example, the reference slope and final recovered values can be measured in a laboratory for conditions that are similar to the known load conditions imposed by the step of applying 110. Alternatively, the reference values can be calculated using models of the different battery chemistries. In another embodiment, the reference slope and final recovered voltage values are combined as a ratio and compared to reference ratios for various battery chemistries. A set of reference values for the applicable battery chemistries under similar conditions imposed by an electronic device is readily obtainable by one skilled in the art without undue experimentation.

The best guess of battery chemistry corresponds to the battery chemistry associated with the reference recovery slope or combined reference recovery slope and final recovered voltage that most closely matches the recovery slope or combined recovery slope and measured final recovered voltage. A number of techniques for generating a slope value and for making a comparison to determine a best guess are known in the art that are applicable to the step of determining 140 the battery chemistry. All such techniques are considered to be within the scope of the present invention.

It has been observed that the voltage recovery of a battery is basically linear with time during approximately the first second following the removal 120 of the load. In addition, the slope and final recovered voltage of the voltage recovery characteristic have been found to be nominally different for various different battery chemistries. In other words, the voltage recovery characteristics of a battery are representative of the kinetic limitations of the battery chemistry. Thus, according to the invention, the slope of the voltage recovery and the slope in conjunction with the final recovered voltage are useful metrics with which to make a best guess determination of the battery chemistry.

An experiment was performed as a proof of concept of the method 100. A 6 W load was applied for a 2 second period to each of three groups of different battery chemistries, each group having four AA battery cells. The three different battery chemistries tested were Energizer high-energy lithium (lithium-iron disulfide), Energizer Accu NiMH, and Energizer E2 alkaline. The voltage recovery was monitored at intervals of 0.1 seconds for a 1 second recovery period over a full discharge of the battery. A plot of the measured voltage recovery slope during the 1 second recovery period versus a final recovered voltage over the discharge of the batteries for the three battery chemistries is illustrated in FIG. 2.

While there is some observed overlap in recovery slope behavior between the three chemistries represented in the experiment, especially at some points during discharge, distinctions can be made between the different battery chemistries. For example, the rechargeable NiMH battery chemistry can be distinguished from the non-rechargeable alkaline and high-energy lithium chemistries quite reliably early in the discharge period. Further, the alkaline chemistry can be distinguished from lithium chemistry later in the discharge period. Advantageously, the most critical distinction is the early distinction between rechargeable and non-rechargeable chemistries. If this distinction can be made reliably whenever fresh batteries are inserted in a device, then the method 100 is adaptable to prevent a recharging attempt on a non-rechargeable battery, and the associated deleterious effects. Since neither alkaline nor lithium are rechargeable, the fact that they behave similarly early in the recovery period in the above described experiment is not as critical.

Figure 2:
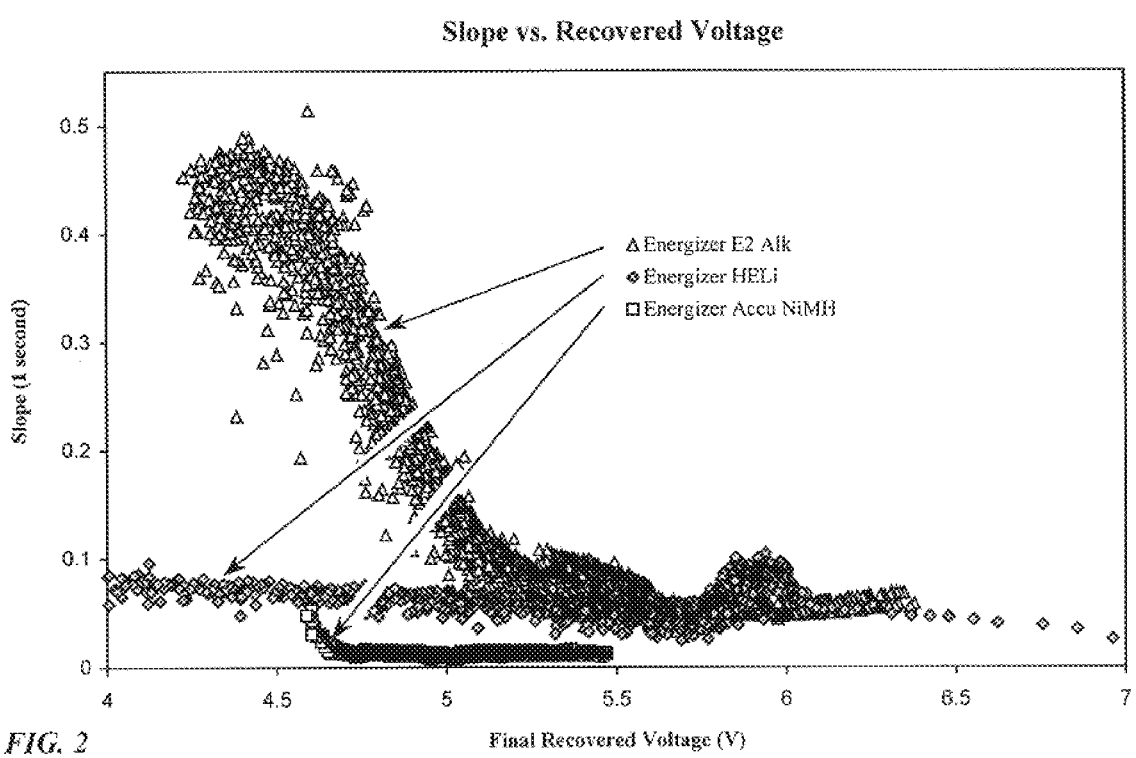
FIG. 2 illustrates a graph of recovered voltage/time versus recovered voltage for various battery chemistries according to the method of FIG. 1.

An example of a look-up table that could be used in the step of determining 140 of the method 100 can be constructed from the proof of concept experiment data plotted in FIG. 2. Such an example look-up table is provided in Table 1 below. The 'Chemistry Determination Condition' column of Table 1 provides conditions under which a given battery chemistry would be selected based on data from the step of monitoring 130 an unknown battery chemistry. Thus, if the recovery slope RS is less than 0.025, the battery chemistry of an unknown battery would be determined 140 to be Nickel Metal Hydride or Nickel Cadmium when using Table 1 as the look-up table in the step of determining 140. Likewise, if the sum of the monitored 130 recovery slope RS and the final recovered voltage FRV is greater than 0.351, the unknown battery chemistry would be determined 140 to be High Drain Alkaline or Alkaline based the look-up table of Table 1. While the proof of concept experiment did not include Nickel Cadmium and standard Alkaline, these two battery chemistries are included in the Table 1 based on reasonable engineering expectations for these chemistries relative to the tested chemistries. Since NiCd and NiMH batteries behave similarly during discharge, as do Standard and High Drain Alkaline batteries, the distinction between them is not a critical one for the purposes of fuel gauging or rechargeability determination.

TABLE 1

Example Look-up Table for Method 100 wherein RS is the monitored recovery slope and FRV is the final recovered voltage value.

| Battery Chemistry | Chemistry Determination Condition |
| --- | --- |
| Nickel Cadmium | RS <= NiMH |
| Nickel Metal Hydride (Energizer Accu NiMH) | RS < 0.025 |
| High Energy Lithium (Energizer HELi) | (RS + 0.054(FRV)) < 0.351 or (FRV > 5.7) and ((RS − 0.014FRV) > 0.025 |
| High Drain Alkaline (Energizer E2 Alk) | (RS + 0.054(FRV)) > 0.351 |
| Alkaline | RS > High Drain Alkaline |

The proof of concept experiment and example look-up table described hereinabove are not intended to limit the scope of the method 100 in any way. The method 100 includes monitoring 130 the voltage more closely than described above for the proof of concept experiment. Further, the method 100 includes monitoring the voltage for a longer recovery period of time and curve fitting the data.

In another aspect of the invention, a method 200 of identifying battery chemistry of batteries in an electronic device is provided. The method 200 of identifying battery chemistry comprises monitoring voltage decline immediately after the application of a moderately high load to the battery. Preferably, the load has a known and relatively repeatable effect on the battery. Since it has been observed that each battery chemistry behaves differently in response to a moderate or greater drain on the battery, the battery chemistry can advantageously be identified or determined with relative accuracy from monitoring the drain or voltage decline effects with respect to time as a result of the application of the load.

Figure 3:
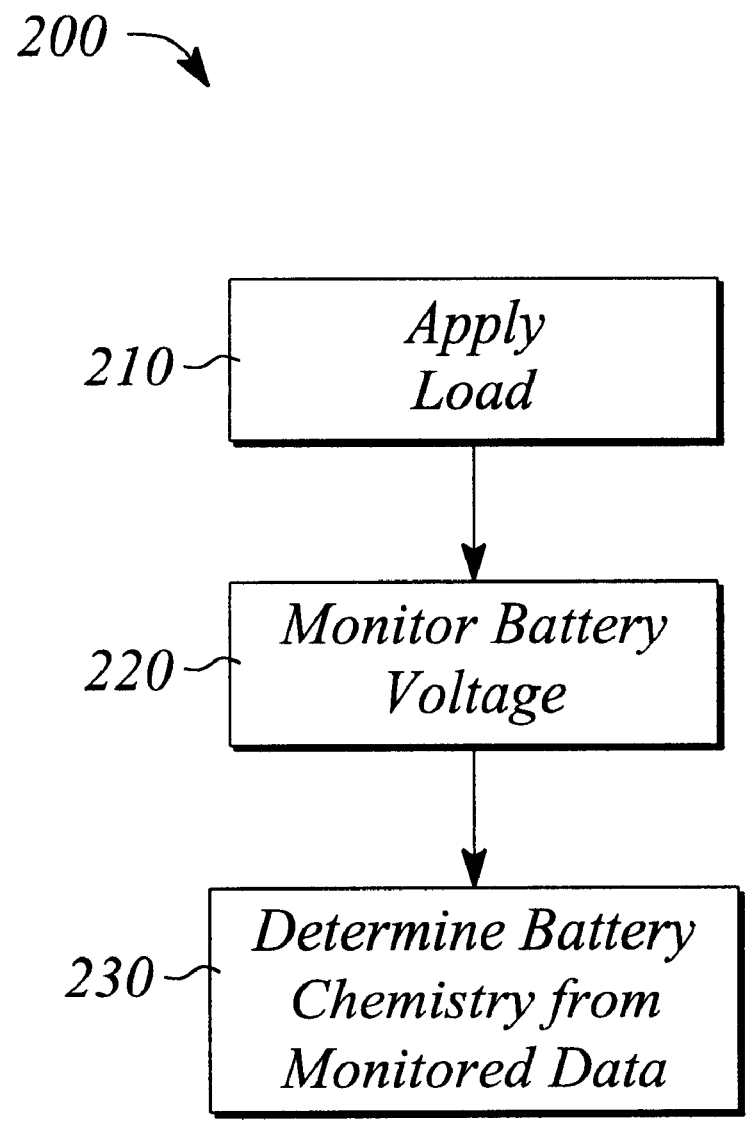
FIG. 3 illustrates a flow chart of another embodiment of a method of the present invention.

FIG. 3 illustrates a flow chart of the method 200. The method 200 of identifying battery chemistry comprises the step of applying 210 a moderately high load to a battery during a load period. The step of applying 210 is essentially the same as the step of applying 110 of the method 100 and the load period and moderately high load are as defined hereinabove. The method 200 of identifying further comprises monitoring 220 voltage of the battery during a decline period at time intervals of less than the decline period, starting just as the load is applied 210. The decline period is less than or equal to the transient load period, which is less than or equal to the load period. The time intervals at which the battery voltage is monitored 220 typically are each less than or equal to 20% of the decline period. Preferably, each time interval is approximately 0.1 seconds.

The method 200 further comprises determining 230 the battery chemistry of the battery from voltage decline or depression data as a function of time obtained during the step of monitoring 220. Preferably, the determination 230 of the battery chemistry is made by generating a voltage decline slope value from the measured battery voltage data collected during the step of monitoring 220. The decline slope is then compared to a set of reference decline slope values. More preferably, the determination 230 is made by comparing the decline slope in conjunction with a measured final depressed voltage to a set of reference decline slope and final depressed voltage values. The measured final depressed voltage is the lowest voltage measured during the decline period. A best guess of the battery chemistry is then made based on the comparison.

In a preferred embodiment, the set of reference decline slope values and final depressed voltage values are stored in the form of a look-up table, each entry in the table being a slope value associated with a different battery chemistry. Preferably, the reference decline slope and final depressed voltage values for a set of battery chemistries are predetermined and applicable to the load conditions of the step of applying 210. For example, the reference decline slope and final depressed voltage values can be measured in a laboratory for conditions that are similar to the known load conditions imposed by the step of applying 210. Alternatively, the reference values can be calculated using models of the different battery chemistries. In another embodiment, the reference slope and final depressed voltage values are combined as a ratio and compared to reference ratios for various battery chemistries. A set of reference values for the applicable battery chemistries under similar conditions imposed by an electronic device is readily obtainable by one skilled in the art without undue experimentation.

The best guess of battery chemistry corresponds to the battery chemistry associated with the reference decline slope or combined reference decline slope and final depressed voltage that most closely matches the decline slope or combined decline slope and measured final depressed voltage. A number of techniques for generating a slope value and for making a comparison to determine a best guess are known in the art that are applicable to the step of determining 230 the battery chemistry. All such techniques are considered to be within the scope of the present invention.

In general, it has been observed that the voltage depression or decline of a battery is basically a linear function with respect to time during approximately the first second after the load is applied. In addition, it has been found that the slope of the voltage depression and the final depressed voltage are nominally different for different battery chemistries. Thus, according to the invention, the slope of the voltage depression and the final depressed voltage due to the application of a moderate or greater load can be used to make a best guess at the battery chemistry. An experiment was performed as proof of concept of the method 200. A 6 W load was applied for a 2 second load period to each of three groups of different battery chemistries, each group having four AA battery cells. The three different battery chemistries tested were Energizer high-energy lithium, Energizer Accu NiMH, and Energizer E2 alkaline. The voltage decline was monitored in intervals of 0.1 seconds for a 1 second discharge period. A graph of the measured slope of the voltage decline in the 1 second discharge period versus the final depressed (lowest) voltage achieved is illustrated in FIG. 4.

Figure 4:
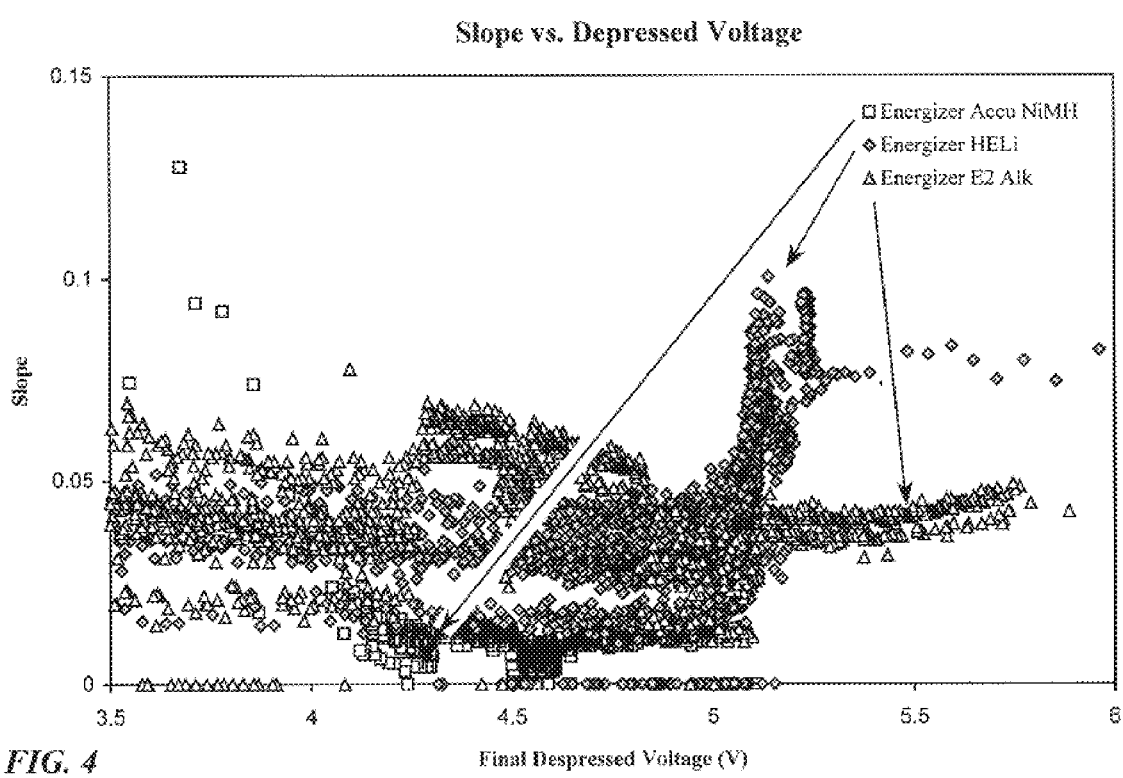
FIG. 4 illustrates a graph of voltage drop/time versus final depressed voltage for various battery chemistries according to the method of FIG. 3.

The graph in FIG. 4 illustrates that different battery chemistries are distinguishable from one another. The graphed voltage decline data in FIG. 4 show that the different battery chemistries tend to organize themselves into roughly distinguishable regions separating the chemistries. While there is some overlap in voltage decline behavior between chemistries during some points during discharge of the battery, distinctions can be made for the different battery chemistries. For example, the rechargeable NiMH battery chemistry can be distinguished from the non-rechargeable alkaline and high-energy lithium chemistries quite reliably over the life of the battery. Advantageously, the most critical distinction is the distinction between rechargeable and non-rechargeable chemistries, for the reasons mentioned above.

An example of a look-up table that could be used in the step of determining 230 of method 200 can be constructed from the proof of concept experiment data plotted in FIG. 4. Such an example look-up table is provided in Table 2 below. The 'Chemistry Determination Condition' column of Table 2 provides conditions under which a given battery chemistry would be selected based on data from the step of monitoring 220 an unknown battery chemistry. Thus, if the decline slope DS is less than 0.02, the battery chemistry of an unknown battery would be determined 230 to be Nickel Metal Hydride or Nickel Cadmium when using Table 2 as the look-up table in the step of determining 230. Likewise, if the monitored 220 final depressed voltage FDV multiplied by 0.023 added to the decline slope DS is greater than 0.151, the unknown battery chemistry would be determined 230 to be 'High Drain Alkaline' or Standard Alkaline based the look-up table of Table 2. While the proof of concept experiment did not include Nickel Cadmium and standard Alkaline, these two battery chemistries are included in the Table 2 based on reasonable engineering expectations for these chemistries relative to the tested chemistries.

TABLE 2

Example Look-up Table for Method 200 wherein DS is the monitored decline slope and FDV is the final depressed voltage value.

| Battery Chemistry | Chemistry Determination Condition |
| --- | --- |
| Nickel Cadmium | DS <= NiMH |
| Nickel Metal Hydride | DS < 0.02 |
| (Energizer Accu NiMH) | |
| High Energy Lithium | ((DS + 0.023(FDV)) < 0.151) or |
| (Energizer HELi) | ((FDV > 4.9) and (DS > 0.05)) |
| High Drain Alkaline | ((DS + 0.023(FDV)) > 0.151) |
| (Energizer E2 Alk) | |
| Alkaline | DS > High Drain Alkaline |

The proof of concept experiment and example look-up table described hereinabove for method 200 are not intended to limit the scope of the method 200 in any way. The method 200 includes monitoring 220 the voltage more closely than described above for the proof of concept experiment. Further, the method 200 includes monitoring 220 the voltage for a longer discharge period of time and curve fitting the data.

In still another aspect of the invention, a method 300 of identifying battery chemistry of batteries in an electronic device comprises monitoring voltage decline, starting just as a moderately high load is applied, and then monitoring voltage recovery just after the load is removed. Since each battery chemistry tends to behave differently in response to the application a moderately high load, and then behave differently during subsequent recovery after the load is removed, the battery chemistry of a given battery advantageously can be identified or determined with reasonable accuracy. This method is especially useful for distinguishing rechargeable (NiMH) batteries from non-rechargeable batteries within an electronic device.

Figure 5:
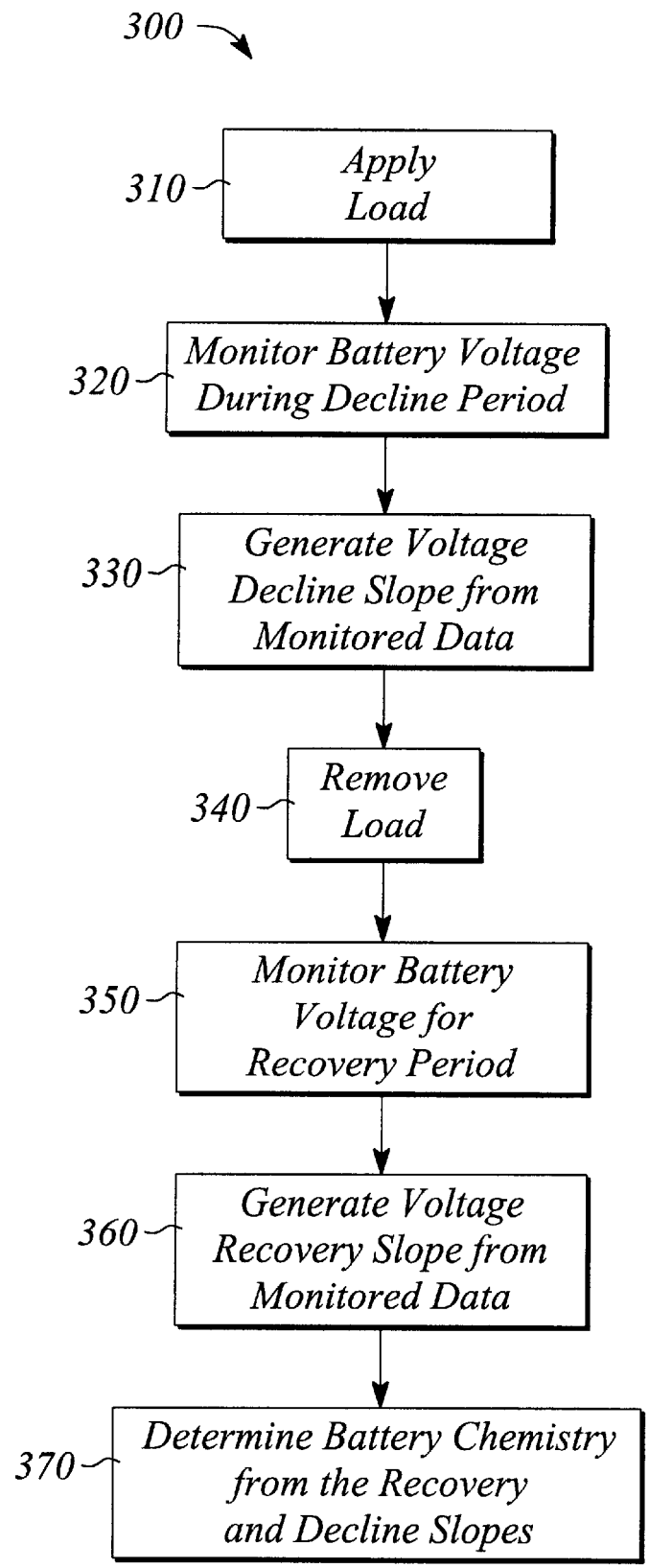
FIG. 5 illustrates a flow chart of still another embodiment of a method of the present invention.

FIG. 5 illustrates a flow chart of the method 300. The method 300 comprises the step of applying 310 a moderately high load to a battery for a load period of time. The step of applying 310 is essentially the same as the step of applying 110 of the method 100 and the load period and moderately high load are as defined hereinabove. The method 300 further comprises monitoring 320 voltage of the battery during a decline period at first time intervals that are less than the decline period, starting just as the load is applied 310. The first time intervals and the decline period are equivalent to the time intervals and the decline period defined in the method 200. The method 300 further comprises generating 330 a voltage decline slope from voltage decline data obtained during the decline period in the step of monitoring 320. The method 300 further comprises the step of removing 340 the load and the step of monitoring 350 the voltage of the battery just after the load is removed 340 for a recovery period at second time intervals that are less than the recovery period. The second time intervals and the recovery period are equivalent to the time intervals and the recovery period defined in the method 100. The method 300 still further comprises the step of generating 360 a voltage recovery slope from voltage recovery data obtained during the recovery period in the step of monitoring 350. The method 300 yet still further comprises the step of determining 370 the battery chemistry of the battery from the decline slope and the recovery slope data generated in the steps of generating 330, 360. The step of determining 370 is essentially a combination of the steps of determining 140 and 230 from the methods 100 and 200, respectively. The decline slope and recovery slopes are compared to respective sets of reference slopes and a best guess is made as to battery chemistry. The comparison, reference slope generation and best guess are essentially the same as those described and defined in methods 100 and 200 above.

An experiment was performed as proof of concept of the method 300. A 6 W load was applied for a 2 second load period to each of three groups of different battery chemistries, each group having four AA battery cells. The three different battery chemistries tested were Energizer high-energy lithium, Energizer Accu NiMH, and Energizer E2 alkaline. The voltage decline was monitored in intervals of 0.1 seconds for a 1-second load period and the slope of the decline was measured. When the load was removed, the voltage recovery was monitored in intervals of 0.1 seconds for 1 second and the slope of the recovery was measured. A graph of the voltage depression slope versus the voltage recovery slope is illustrated in FIG. 6.

Figure 6:
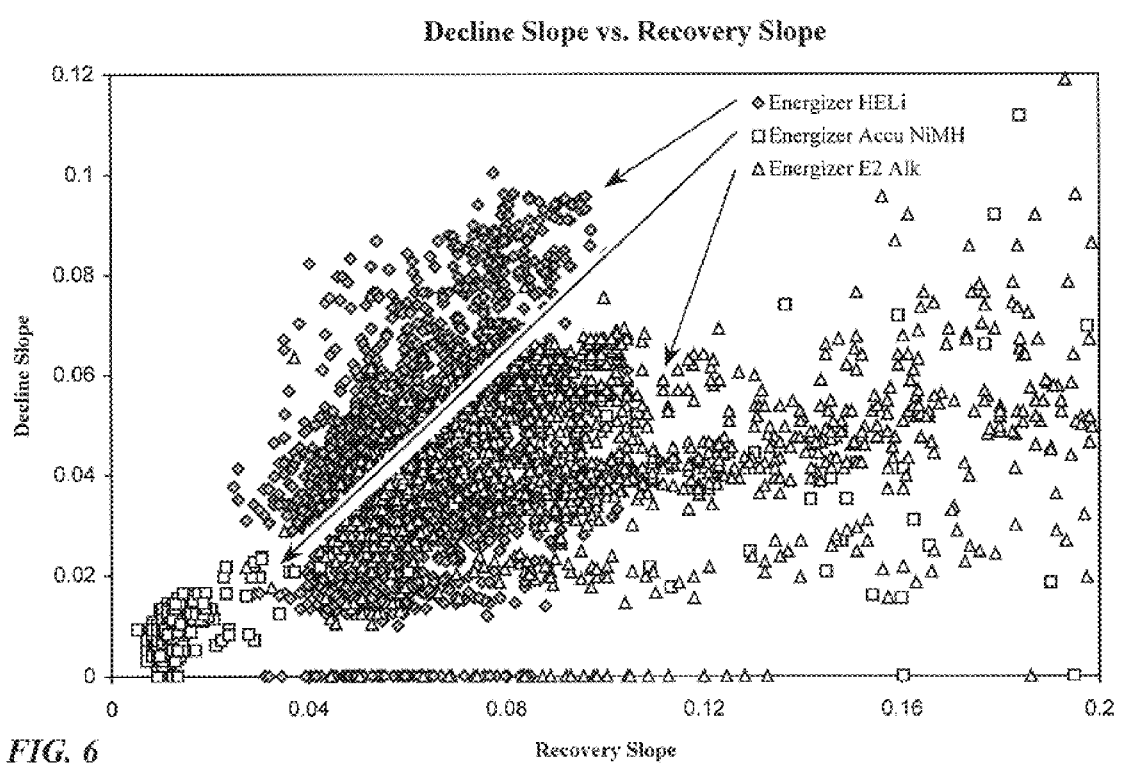
FIG. 6 illustrates a graph of a voltage depression slope versus a voltage recovery slope for various battery chemistries according to the method of FIG. 5.

The results illustrated in FIG. 6 illustrate that different battery chemistries are distinguishable based on their respective decline and recovery responses to the application of a load. In FIG. 6 it can be seen that the results for the different battery chemistries tend to organize themselves roughly into regions based on chemistry. While there is some overlap between chemistries at some points during the discharge of the battery, distinctions can be made for the different battery chemistries. The method 300 is very effective in separating rechargeable chemistries from the non-rechargeable chemistries.

Further, the method 300 is somewhat effective at separating the alkaline chemistry from the photo lithium chemistry. For example, the rechargeable NiMH battery chemistry can be distinguished from the non-rechargeable alkaline and high-energy lithium chemistries very reliably until very near the end of the discharge of the NiMH batteries. Advantageously, the most critical distinction is the distinction between rechargeable and non-rechargeable chemistries, for the reasons mentioned above. Alkaline and photo lithium (lithium-iron disulfide) batteries can also be distinguished at some points during their battery lives, though this distinction is not nearly as critical, since they behave far more similarly to each other during discharge than either of them compared to NiMH batteries.

An example of a look-up table that could be used in the step of determining 370 of method 300 can be constructed from the proof of concept experiment data plotted in FIG. 6. Such an example look-up table is provided in Table 3 below. The 'Chemistry Determination Condition' column of Table 3 provides conditions under which a given battery chemistry would be selected based on data from the steps of monitoring 320, 350 an unknown battery chemistry. Thus, if the decline slope DS from the step of generating 330 plus 3.18 times the recovery slope RS from the step of generating 360 is less than 0.105, the battery chemistry of an unknown battery would be determined 370 to be Nickel Metal Hydride or Nickel Cadmium when using Table 3 as the look-up table in the step of determining 370. While the proof of concept experiment did not include Nickel Cadmium and standard Alkaline, these two battery chemistries are included in the Table 3 based on reasonable engineering expectations for these chemistries relative to the tested chemistries.

TABLE 3

Example Look-up Table for Method 300 wherein DS is the monitored decline slope and RS is the monitored recovery slope.

| Battery Chemistry | Chemistry Determination Condition |
| --- | --- |
| Nickel Cadmium | DS and/or RS <= NiMH |
| Nickel Metal Hydride (Energizer Accu NiMH) | DS + 3.18(RS) < 0.105 |
| High Energy Lithium (Energizer HELi) | ((DS − 0.692(RS)) > 0.012) or ((DS + 3.09(RS)) < 0.017) or ((RS < 0.9) and ((DS − 0.280(RS)) < 0.007)) |
| High Drain Alkaline (Energizer E2 Alk) | ((DS − 0.692(RS)) < 0.012) |
| Alkaline | DS and/or RS > High Drain Alkaline |

The proof of concept experiment and example look-up table described for method 300 hereinabove are not intended to limit the scope of the method 300 in any way. The method 300 includes monitoring 320, 350 the voltage more closely than described above for the proof of concept experiment. Further, the method 300 includes monitoring 320, 350 the voltage for longer periods of time and curve fitting the data.

The steps of applying 110, 210, 310 and the steps of removing 120, 340 in the methods 100, 200, 300 preferably are performed implicitly (i.e., automatically) by the electronic device as a part of the device's normal operation and therefore, these steps are not intended to limit the scope of the present invention. In essence, the invention comprises monitoring the battery, measuring voltage data and determining the battery chemistry as a moderately high load is applied and/or after the moderately high load is removed automatically during a device operation that requires such a moderately high load. However, it is within the scope of the present invention for the load to be artificial (i.e., not as a part of normal operation) and therefore, can be explicitly applied and removed for the methods of the invention.

In yet another aspect of the present invention, a battery chemistry identification system 400 that implements the method 100, 200, 300 of the present invention in an electronic device is provided. The monitoring system 400 eliminates the need to make compromises in designing a one-size-fits-all battery system for electronic devices. Further, the system 400 automates the method 100, 200, 300 of battery type identification in the electronic device during normal operation without the need for an artificial load.

Figure 7:
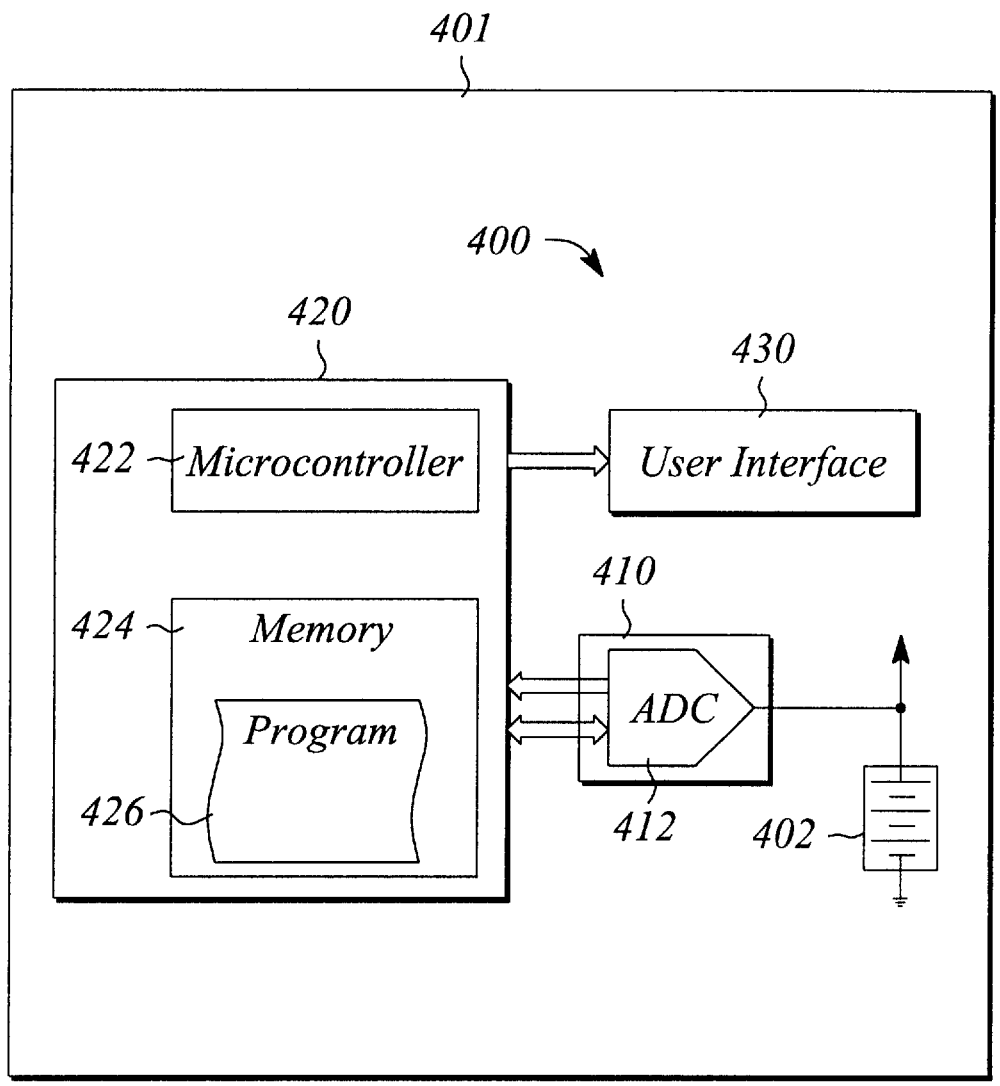
FIG. 7 illustrates system that implements the method of the present invention in an electronic device.

A block diagram of the battery chemistry identification system 400 in an electronic device 401 is illustrated in FIG. 7. The battery chemistry identification system 400 comprises a monitoring subsystem 410 to monitor the voltage of an installed battery 402 for a short period of time in response to a stimulus (load) and a calculation and identification subsystem 420 to calculate the slope (dv/dt) of the voltage over time and to make a best guess identification of the battery chemistry. The stimulus or load that is used for the battery chemistry identification system 400 according to the invention was described hereinabove.

In a preferred embodiment of the system 400, the monitoring subsystem 410 comprises a voltage sampler 412 or voltmeter. The voltage sampler 412 periodically samples and stores or records the battery voltage. In a preferred embodiment, the voltage sampler 412 is a sampling analog to digital converter (ADC). The ADC 412 samples the battery voltage and converts the sampled voltage value into a digital representation or digital word. The digital word is output by the ADC 412 after each periodic sample. One digital word is generated for each sample of the voltage. The ADC 412 may operate continuously, generating a continuous sequence of digital words or an external controller may be used to trigger it to take more voltage samples at a specific time or during a specific time interval, such as just as or after the load is applied or removed. There are a wide variety of ADCs known in the art, each with its own particular advantages and disadvantages. One skilled in the art would be able to choose an appropriate ADC or other voltage sampler 412 suitable for the monitoring subsystem 410 of a given battery-powered electronic device 401 without undue experimentation.

The calculation and identification subsystem 420 of the preferred embodiment of the system 400 comprises microprocessor or microcontroller 422, a memory 424, and a computer program 426. The computer program or subroutine 426 resides in the memory 424 as either firmware or software. The microprocessor or microcontroller 422 and memory 424 are preferably part of the electronic device 401 and thus advantageously, are not dedicated to the battery chemistry identification system 400.

The computer program or subroutine 426 is executed by the microprocessor or microcontroller 422. The program 426 implements the steps of methods 100, 200, and/or 300. Specifically, the microprocessor 422 executes the program 426 when it receives the digital words containing the voltage samples from the monitoring subsystem 410. The program 426 computes the appropriate slope value or other values, compares the computed slope and/or other values to a set of reference values, and makes a best guess at the battery chemistry. Preferably, the reference values are predetermined and stored in the memory 424 as a look-up table and are as defined hereinabove. In another embodiment, the monitoring subsystem 410 and/or the calculation subsystem 420 can be implemented as custom discrete circuitry or as an application-specific integrated circuit (ASIC).

The identification system 400 further comprises a user interface 430. The user interface 430 provides information to the user of the device 401. The user interface 430 is preferably a user interface of the device 401, and thus advantageously, is shared with other device 401 functions instead of being dedicated to the system 400. The information provided to the user by the interface 430 can include, but is not limited to, information on battery charge status (e.g. fuel gauge), indications of battery type, troubleshooting and/or diagnostic information, and recommendations. For example, the electronic device 401 incorporating the system 400 could use the user interface 430 to alert the user to differences among batteries 402. Such an alert mechanism could help to prevent confusion about whether a battery life issue is due to the proper functioning of the device or the user's battery choice. For example, in a manner similar to that associated with the methods 100, 200 and 300, the electronic device 401 could display a message, such as: "Alkaline batteries detected. For better performance, select high energy lithium or nickel-metal hydride batteries."

In one embodiment of the system 400, the monitoring subsystem 410 monitors voltage recovery with time, starting just after a moderately high load is removed from the battery 402 (as a part of normal operation of the electronic device 401). The calculation and identification subsystem 420 calculates the voltage recovery slope and compares the slope and a measured recovered voltage to a set of predetermined reference recovery values before making a best guess battery chemistry identification. In another embodiment of system 400, the monitoring subsystem 410 monitors voltage decline with time data, starting just as a moderately high load is applied to the battery 402 (as a part of normal electronic device 401 operation). The calculation and identification subsystem 420 calculates the voltage depression slope and compares the depression slope and a measured final depressed voltage to a set of predetermined reference decline slope values and final depressed voltage for various battery chemistries to make the best guess at battery chemistry identification. In still another embodiment of the system 400, the monitoring subsystem 410 monitors both voltage recovery and voltage decline with time of the battery 402 as a part of normal device 401 operation. The calculation and identification circuit 420 calculates both a voltage recovery slope and a voltage depression slope and compares the voltage recovery and depression slopes to a set of predetermined reference recovery and depression slope values before making the best guess battery chemistry identification.

The system 400 and methods 100, 200 and 300 of identifying battery chemistry provides improved accurate battery fuel-gauging and battery end-of-life or cut-off point determination in the electronic device. As discussed hereinabove, fuel gauging is often calibrated for a particular battery chemistry. The system 400 and methods 100, 200, and 300 of the present invention can automatically determine the battery chemistry of an installed battery. Once the battery chemistry is determined, the fuel gauging can be adjusted to better match the detected chemistry. For example, instead of calibrating the fuel gauge of an electronic device for a single typical or 'worst case' chemistry as is conventionally done, a set of fuel gauge calibrations can be stored in the electronic device, one calibration for each possible battery chemistry. Once the battery chemistry of the installed battery is determined, the appropriate calibration can be retrieved from storage and used for fuel gauging. An extension of this concept is to have fuel-gauging algorithms that are customized for each of the battery chemistries. The appropriate algorithm is selected and used based on the determined battery chemistry of the installed battery. Thus, the system 400 and methods 100, 200 and 300 of the present invention can significantly improve the accuracy of fuel gauging in electronic devices that can use multiple battery chemistries.

Similarly, the accuracy of battery end-of-life and cut-off point determinations can be improved by the using the determined battery chemistry. As discussed hereinabove, many electronic devices use measurements of battery voltage or other battery characteristics and/or models to predict when the battery is nearing the end of its available charge. Accurate knowledge of when a battery is about to run out of energy is useful to the electronic device for a number of reasons, including but not limited to, providing warnings to the user that the battery is running out (fuel gauging) and assuring that a 'graceful' shut-down of the electronic device can be accomplished before the battery power is depleted. The most accurate predictions of the end-of-life for a given battery depend on knowing the battery chemistry. As with fuel gauging, knowledge of the battery chemistry provided by the system 400 and methods 100, 200 and 300 in conjunction with information stored in the electronic device regarding the end-of-life characteristics of various battery chemistries can be used to select the most appropriate models and or characteristics to use in predicting when the battery will run out of energy. Thus, the system 400 and methods 100, 200 and 300 of the present invention can significantly improve the accuracy of end-of-life and/or cut-off point determination in electronic devices that can use multiple battery chemistries.

Moreover, the system 400 and methods 100, 200 and 300 of identifying battery chemistry can distinguish a rechargeable battery from a non-rechargeable battery. Therefore, the system 400 and methods 100, 200 and 300 are adaptable for safe in-device battery recharging for electronic devices. For example, system 400 and methods 100, 200, and 300 could provide information to a battery charging subsystem (not shown) indicating whether the battery can be safely charged. The battery charging subsystem would use the information to either connect or disconnect the battery 402 from a battery charging source. In other words, if the battery 402 is determined to be of a non-rechargeable type, the battery charging subsystem disconnects from the battery 402 to prevent problems associated with attempting to charge a non-rechargeable battery. Moreover, the user interface 430 could display a message "Non-rechargeable batteries detected. Do not attempt to recharge."

The system 400 implements the method 100, 200, 300 in the electronic device 401 while the device 401 is in normal operation without adversely affecting the life of the battery 402 or the user's enjoyment of the device 401. No artificial load needs to be placed on the batteries 402 in the device 401. Identification can be made each time the battery 402 is placed under a load (during normal device 401 operation) to initiate monitoring.

Thus there have been described a novel method 100, 200, 300 of battery chemistry identification and a system 400 that implements the method 100, 200, 300 in an electronic device 401. It should be understood that the above-described embodiments are merely illustrative of the some of the many specific embodiments that represent the principles of the present invention. Clearly, those skilled in the art can readily devise numerous other arrangements without departing from the scope of the present invention.

What is claimed is:

1. A method of identifying a battery chemistry of a battery in an electronic device comprising the steps of:

applying a moderately high load to a battery for a load period of time;

removing the load;

just as the load is removed, monitoring voltage of the battery for a recovery time period at time intervals that are shorter than the recovery period; and determining the battery chemistry of the battery from voltage recovery with time data obtained in the step of monitoring.

2. The method of claim 1, wherein the step of determining comprises the steps of:

generating a measured recovery voltage slope from the voltage recovery with time data; and comparing the measured recovery voltage slope to a set of reference slope values for different battery chemistries, wherein the battery chemistry is identified by the reference slope that most closely matches the measured recovery voltage slope.

3. The method of claim 1, wherein the step of determining comprises the steps of:

generating a measured recovery voltage slope and a final recovered voltage from the voltage recovery with time data; and comparing the measured recovery voltage slope and the final recovered voltage to a set of reference recovery voltage slope and final recovered voltage values for different battery chemistries, wherein the battery chemistry is identified by the reference recovery voltage slope and the recovered voltage value that most closely match the measured recovery voltage slope and the final recovered voltage.

4. A method of identifying a battery chemistry of a battery in an electronic device comprising the steps of:

applying a moderately high load to a battery during a load period;

just as the load is applied, monitoring voltage of the battery for a decline period at time intervals of less than the decline period; and determining the battery chemistry of the battery from voltage decline with time data obtained during the step of monitoring.

5. The method of claim 4, wherein the step of determining comprises the steps of:

generating a measured voltage depression slope from the voltage decline with time data; and comparing the measured voltage depression slope to a set of reference voltage decline slope values for different battery chemistries, wherein the battery chemistry is identified by the reference voltage decline slope that most closely matches the measured voltage depression slope.

6. The method of claim 4, wherein the step of determining comprises the steps of:

generating a measured voltage depression slope and a final depressed voltage generated from the voltage decline with time data; and comparing the measured voltage depression slope and the final depressed voltage to a set of reference voltage decline slope and final depressed voltage values for different battery chemistries, wherein the battery chemistry is identified by the reference voltage decline slope and recovered voltage values that most closely match the measured voltage depression slope and the final depressed voltage.

7. A method of identifying a battery chemistry of a battery in an electronic device comprising the steps of:

applying a moderately high load to a battery for a load period of time;

just as the load is applied, monitoring voltage of the battery for a decline period at first time intervals that are less than the decline period;

measuring a first slope of the voltage from voltage decline data obtained in the step of monitoring with the load applied;

removing the load;

just as the load is removed, monitoring the voltage of the battery for a recovery period at other time intervals that are less than the recovery period;

measuring a second slope of the voltage from voltage recovery data obtained during the step of monitoring while the load is removed; and determining the battery chemistry of the battery from the first slope and the second slope.

8. The method of claim 7, wherein the step of determining comprises the steps of:

comparing the first slope and the second slope to a set of reference slopes for voltage depression and voltage recovery for different battery chemistries; and identifying the battery chemistry from the reference slopes that most closely match the first slope and the second slope.

9. The method of claim 1, wherein in the step of determining, a rechargeable battery chemistry is distinguished from a non-rechargeable battery chemistry, and non-rechargeable battery chemistries are distinguished from each other later in a discharge period.

10. The method of claim 4, wherein in the step of determining, a rechargeable battery chemistry is distinguished from a non-rechargeable battery chemistry, and non-rechargeable battery chemistries are distinguished from each other.

11. The method of claim 7, wherein in the step of determining, a rechargeable battery chemistry is distinguished from a non-rechargeable battery chemistry.

12. The method of claim 4, further comprising before the step of determining the steps of:

measuring during the decline period a first slope of the voltage from the voltage decline with time data obtained in the step of monitoring with the load applied;

removing the load;

just as the load is removed, monitoring the voltage of the battery for a recovery period at other time intervals that are less than the recovery period;

measuring a second slope of the voltage during the recovery period from voltage data obtained during the step of monitoring while the load is removed; and wherein the step of determining comprises determining the battery chemistry of the battery from the measured first slope and the measured second slope.

13. The method of claim 1 implemented in an electronic device with a system that comprises:

a monitoring subsystem that collects the voltage recovery with time data of the battery during the recovery period; and a calculation subsystem that calculates a voltage recovery slope from the voltage recovery with time data and compares the voltage recovery slope to a set of reference voltage recovery slope values stored in a look-up table.

14. The method of claim 4 implemented in an electronic device with a system that comprises:

a monitoring subsystem that collects the voltage decline with time data of the battery during the load period; and a calculation subsystem that calculates a voltage depression slope from the voltage decline with time data and compares the voltage depression slope to a set of reference voltage decline slope values stored in a look-up table.

15. The method of claim 7 implemented in an electronic device with a system that comprises:

a monitoring subsystem that collects the voltage decline data and the voltage recovery data of the battery; and a calculation subsystem that calculates the first slope and the second slope from measured data, and compares the first slope and the second slope to a set of reference slopes for voltage depression and voltage recovery stored in a look-up table.

16. A system of battery chemistry identification implemented in an electronic device as a part of normal device operation comprising:

a monitoring subsystem that collects voltage data measured over time from a battery in the electronic device in response to a moderately high load during normal operation; and a calculation subsystem that calculates a slope comprising changes in voltage with changes in time from the collected voltage data, and compares the slope to reference voltage data.

17. The system of claim 16, wherein the monitoring subsystem comprises a analog-to-digital converter that samples battery voltage, and wherein the calculation subsystem comprises a computer program, wherein the computer program is stored in a memory of the electronic device and is executed by a microcontroller of the electronic device.

18. The system of claim 16, wherein the monitoring subsystem comprises a voltage sampler that samples battery voltage, and wherein the calculation subsystem comprises a microcontroller that controls the voltage sampler, a memory, and a computer program stored in the memory as software or firmware, the microcontroller executing the computer program.

19. The system of claim 16, further comprising a user interface that is connected so as to communicate with the calculation subsystem, the user interface providing battery fuel gauge and diagnostic information to a user of the electronic device.

20. The system of claim 16 implemented as an application-specific integrated circuit (ASIC).

* * * * *